(12) United States Patent
Kim et al.

(10) Patent No.: US 12,126,325 B2
(45) Date of Patent: Oct. 22, 2024

(54) ACOUSTIC RESONATOR

(71) Applicant: WISOL CO., LTD., Gyeonggi-do (KR)

(72) Inventors: Byung Hun Kim, Gyeonggi-do (KR);
Tah Joon Park, Gyeonggi-do (KR);
Jong Hyeon Park, Gyeonggi-do (KR);
Chang Kyu Yoon, Gyeonggi-do (KR)

(73) Assignee: WISOL CO., LTD., Gyeonggi-do (KR)

( * ) Notice: Subject to any disclaimer, the term of this patent is extended or adjusted under 35 U.S.C. 154(b) by 273 days.

(21) Appl. No.: 17/898,775

(22) Filed: Aug. 30, 2022

(65) Prior Publication Data
US 2023/0084409 A1 Mar. 16, 2023

(30) Foreign Application Priority Data
Sep. 16, 2021 (KR) .......................... 10-2021-0123737

(51) Int. Cl.
*H03H 9/17* (2006.01)
*H03H 9/02* (2006.01)

(52) U.S. Cl.
CPC ........ *H03H 9/171* (2013.01); *H03H 9/02015* (2013.01); *H03H 9/178* (2013.01)

(58) Field of Classification Search
CPC ........... H03H 9/02015; H03H 9/02157; H03H 9/171; H03H 9/178; H03H 9/02118; H03H 9/173
See application file for complete search history.

(56) References Cited

U.S. PATENT DOCUMENTS

| 2005/0248232 A1* | 11/2005 | Itaya ........................ H03H 3/02 310/320 |
| 2011/0084779 A1* | 4/2011 | Zhang ...................... H03H 3/02 333/187 |
| 2014/0176261 A1* | 6/2014 | Burak ...................... H03H 9/54 333/187 |
| 2021/0050839 A1* | 2/2021 | Pang .................. H03H 9/02118 |

FOREIGN PATENT DOCUMENTS

KR 10-2004-0102390 A 12/2004

* cited by examiner

Primary Examiner — Quan Tra
(74) *Attorney, Agent, or Firm* — Harness, Dickey & Pierce, P.L.C.

(57) ABSTRACT

Provided is an acoustic resonator including: a substrate including a first cavity; a first electrode formed above the substrate; a piezoelectric layer formed on one surface of the first electrode; and a second electrode formed on one surface of the piezoelectric layer, wherein the first electrode and the piezoelectric layer include an overlapping area that corresponds to a first end and a second end of the first cavity, the first electrode has a termination surface formed as an inclined surface of a first acute angle $\theta_1$ outside the overlapping area with respect to the second end of the first cavity, the piezoelectric layer is formed to include a first air bridge area that has a second cavity and is formed between the piezoelectric layer and the first electrode in a vertical direction and between the second end of the first cavity and the termination surface in a horizontal direction.

11 Claims, 5 Drawing Sheets

ACOUSTIC RESONATOR

CROSS-REFERENCE TO RELATED APPLICATION

This application claims priority from Korean Patent Application No. 10-2021-0123737 filed on Sep. 16, 2021 in the Korean Intellectual Property Office, and all the benefits accruing therefrom under 35 U.S.C. 119, the contents of which in its entirety are herein incorporated by reference.

TECHNICAL FIELD

The present disclosure relates to an acoustic resonator for use in radio frequency communication, and more particularly, to a film bulk acoustic resonator (FBAR) in which electrode loss is reduced through an improved air bridge structure.

BACKGROUND

Wireless mobile communication technology requires a variety of radio frequency (RF) components capable of efficiently transmitting information within a limited frequency band. Particularly, among RF components, a filter is one of essential components used in mobile communication technology and enables high-quality communication by selecting a signal needed by a user among a plurality of frequency bands or filtering a signal to be transmitted.

Currently, a dielectric filter and a surface acoustic wave (SAW) filter are used most as an RF filter for wireless communication. The dielectric filter has advantages such as a high dielectric constant, a low insertion loss, stability at a high temperature, high vibration resistance, and high shock resistance. However, the dielectric filter has limitations in miniaturization and monolithic microwave integrated circuit (MMIC) which are recent trends of technology development. Also, an SAW filter has a small size in comparison to the dielectric filter, easily processes a signal, has a simple circuit, and is manufactured using a semiconductor process so as to facilitate mass production. Also, the SAW filter has an advantage of transmitting and receiving high-grade information due to higher side rejection within a passband in comparison to the dielectric filter. However, since an SAW filtering process includes an exposure process using ultraviolet (UV), there is a disadvantage in which a line width of an interdigital transducer (IDT) has a limitation of about 0.5 μm. Accordingly, there is a problem in which it is impossible to cover an ultrahigh frequency band of 5 GHz or more using the SAW filter. Basically, there is a difficulty in forming an MMIC structure and a single chip on a semiconductor substrate.

In order to overcome the above limitations and problems, a film bulk acoustic resonator (FBAR) filter integrated with other active devices on an existing semiconductor (Si or GaAs) substrate to completely implement a frequency control circuit as an MMIC is provided.

The FBAR is a thin film device which is low-cost, small-sized, and features high quality coefficient so as to be applicable to a wireless communication device, a military-use radar in a variety of frequency bands of 900 MHz to 10 GHz. Also, the FBAR is reduced in size as one-several hundredth of the dielectric filter and a lumped constant (LC) filter and has a very smaller insertion loss than the SAW filter. Accordingly, it is apparent that the FBAR is most adequate device for an MMIC which requires high stability and a high quality coefficient.

An FBAR filter is formed by depositing zinc oxide (ZnO), aluminum nitride (AlN), or the like which is a piezoelectric-dielectric material on silicon (Si) or gallium arsenide (GaAs) which is a semiconductor substrate using an RF sputtering method and causes resonation due to a piezoelectric property. That is, the FBAR generates resonance by depositing a piezoelectric film between both electrodes and causing a bulk acoustic wave.

A variety of forms of FBAR structures have been studied until now. In the case of a membrane type FBAR, a silicon oxide film ($SiO_2$) is deposited on a substrate and a membrane layer is formed using a cavity formed through isotropic etching on an opposite side of the substrate. Also, a lower electrode is formed above the silicon oxide film, a piezoelectric layer is formed by depositing a piezoelectric material above the lower electrode using an RF magnetron sputtering, and an upper electrode is formed above the piezoelectric layer.

The above membrane type FBAR has an advantage of less dielectric loss and power loss due to the cavity. However, the membrane type FBAR has problems in which an area occupied by a device is large due to a directivity of the silicon substrate and a yield is decreased by damages due to low structural stability in a follow-up packaging process. Accordingly, recently, in order to reduce a loss caused by the membrane and to simplify a device manufacturing process, an air-gap type FBAR and a Bragg reflector type FBAR have appeared.

The Bragg reflector type FBAR has a structure in which a reflection layer is formed by depositing materials having a high elastic impedance difference on every other layer on a substrate and a lower electrode, a piezoelectric layer, and an upper electrode are sequentially deposited. Here, elastic wave energy which has passed through the piezoelectric layer is not transferred toward the substrate and all reflected by the reflection layer so as to generate efficient resonation. Although the Bragg reflector type FBAR is structurally firm and has no stress caused by bending, it is difficult to form four or more reflection layers having a precise thickness for total reflection and large amounts of time and cost are necessary for manufacturing.

Meanwhile, in an existing FBAR having a structure in which a substrate and a resonance portion are isolated using an air gap instead of a reflection layer, a sacrificial layer is implemented by performing isotropic etching on a surface of a silicon substrate and is surface-polished through chemical-mechanical polishing, an insulation layer, a lower electrode, a piezoelectric layer, and an upper electrode are sequentially deposited, and an air gap is formed by removing the sacrificial layer through a via hole so as to implement an FBAR.

In general, a piezoelectric layer is formed between upper and lower electrodes in an FBAR structure, and the upper and lower electrodes are installed in only a necessary area so as to use a piezoelectric effect. Accordingly, a mechanical anchor loss is great such that reduction in mechanical energy is caused.

In the case of the upper electrode or lower electrode, molybdenum (Mo), ruthenium (Ru), tungsten (W), and the like are used to increase acoustic impedance. Since a skin depth of an electrode material is determined according to a frequency of a filter and a thickness significantly smaller than the skin depth is generally used, it is impossible to transfer charges at a resonance point of the piezoelectric layer, a quality factor is reduced.

One of methods to increase a quality factor at an anti-resonance point is to minimize energy that escapes in the lateral direction.

PRIOR ART LITERATURES

Patent Literature (Patent Literature 0001) Korean Patent Publication No. 10-2004-0102390 (Published on Dec. 8, 2004)

SUMMARY

Aspects of the present disclosure provide an acoustic resonator having an air bridge structure capable of effectively preventing an operation of a piezoelectric layer in an area outside an active area.

Aspects of the present disclosure also provide an acoustic resonator having a structure in which a portion of a piezoelectric layer is removed to relieve a stress of the piezoelectric layer.

Aspects of the present disclosure also provide an acoustic resonator having an air bridge structure capable of preventing energy from escaping in a lateral direction.

In one general aspect, there is provided an acoustic resonator including: a substrate including a first cavity; a first electrode formed above the substrate; a piezoelectric layer formed on one surface of the first electrode; and a second electrode formed on one surface of the piezoelectric layer, wherein the first electrode and the piezoelectric layer include an overlapping area that corresponds to a first end and a second end of the first cavity, the first electrode has a termination surface formed as an inclined surface of a first acute angle $\theta_1$ outside the overlapping area with respect to the second end of the first cavity, the piezoelectric layer is formed to include a first air bridge area that has a second cavity and is formed between the piezoelectric layer and the first electrode in a vertical direction and between the second end of the first cavity and the termination surface of the first electrode in a horizontal direction.

In addition, the piezoelectric layer may be terminated by an etching area in a portion thereof, and thereby formed to have a first part to which the first air bridge area belongs and a second part that does not make contact with the first electrode and is spaced apart from the first part.

The second cavity may be formed to make contact with at least one of the termination surface of the first electrode, a lower surface of the second electrode, or bottom surfaces of the first and second parts of the piezoelectric layer that are formed as the piezoelectric layer is terminated by the etching area in the portion thereof.

The piezoelectric layer may be formed such that a termination surface of the first part formed by the etching area overlaps the termination surface of the first electrode.

The second electrode may be formed in a V- or U-shape or in a shape similar to a V- or U-shape in a direction of the first electrode so as to cover inclined termination surfaces of the first part and the second part that are spaced apart from each other in the etching area.

Also, the second electrode may be formed such that a lowermost surface of the V- or U-shape or the shape similar to a V- or U-shape makes contact with the second cavity.

The piezoelectric layer may be formed to include the first air bridge area in which upper and lower surfaces of the piezoelectric layer extend upwardly at a second acute angle $\theta_2$, the upper surface in contact with the second electrode is downwardly inclined at a third acute angle $\theta_3$ and terminated and the lower surface in contact with the second cavity is downwardly inclined at the first acute angle $\theta_1$ and terminated.

The first acute angle $\theta_1$, the second acute angle $\theta_2$, and the third acute angle $\theta_3$ may be 45 degrees or less, and the third acute angle $\theta_3$ may be greater than the first acute angle $\theta_1$.

The piezoelectric layer may have the termination surface with a thickness equal to a difference between the third acute angle $\theta_3$ and the first acute angle $\theta_1$.

The second electrode may include a second air bridge area that has a third cavity and is formed between the second electrode and the piezoelectric layer in the vertical direction and in a portion of the overlapping area in the horizontal direction.

Also, the second electrode may be formed to have a fourth cavity with a width proportional to a thickness of the second cavity, between the second electrode and an upwardly inclined surface of the piezoelectric layer.

The fourth cavity may be formed to overlap the second cavity and an overlapping area of the fourth cavity and the second cavity may extend beyond the upwardly inclined surface.

The fourth cavity on the piezoelectric layer which is formed by the first air bridge area of the piezoelectric layer may be connected to the third cavity formed by the second air bridge area of the second electrode.

According to the present disclosure, it is possible to effectively prevent the operation of a piezoelectric layer outside the active area.

In addition, the piezoelectric layer is partially removed so that stress of the piezoelectric layer may be released and anchor loss may be reduced, thereby improving the quality factor at a resonance point.

The quality factor can be improved at an antiresonance point by preventing energy from escaping in a lateral direction.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

Figure 1:
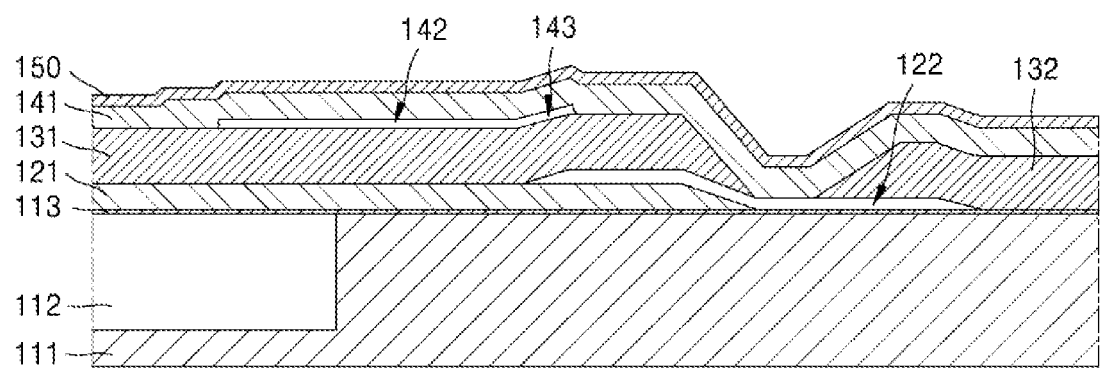
FIG. 1 is a cross-sectional view of an acoustic resonator according to an embodiment of the present disclosure.

Before the detailed description of the present disclosure, it should be understood that terms or words used in the specification and the appended claims should not be construed as being limited to commonly employed meanings or dictionary definitions, but interpreted based on meanings and concepts corresponding to the technical idea of the invention, on the basis of the principle that inventors are allowed to define terms appropriately for the best explanation of their invention.

That is, it should be understood that the terms used herein are used only to described preferred embodiments of the present disclosure, but are not used to limit the contents of the present disclosure, and the terms are defined in consideration of various possibilities of the present disclosure.

Further, in the following description, a predetermined component expressed in the singular may contain a plurality of components unless otherwise indicated. Similarly, components expressed in the plural may contain a singular concept.

Throughout the specification, when it is described that an element "includes" or "comprises" another element, it may mean that the first element may further includes any other element without precluding the other element unless a particularly contradictory description is made.

Moreover, when it is described that any element is "present within or connected with" another element, the first element may be directly connected with the second element to contact the second element and may be spaced apart from each other, and when they are spaced apart from each other by a specific distance, a third element or unit for fixing or connecting the first element with the second element may be present and a description of the third element or unit may be omitted.

Meanwhile, when it is described that any element is "directly connected with" another element, it should be understood that a third element or unit is not present.

Similarly, it should be construed that other expressions that describe the relationships between elements, such as "between," "directly between," "adjacent to," and "directly adjacent to" may have the same purpose.

Further, it should be understood that in the specification, if terms, such as "one surface," "an opposite surface," "one side," "an opposite side," "first," and "second" are used, they are used to clearly distinguish one element form the other elements, the meaning of the corresponding element is not restricted by the terms.

Further, it should be understood that in the specification, the terms, such as "upper," "lower," "left," and "right," which related to the locations, are used, they indicate a relative location in the drawing, and should not be construed to mention an absolute location unless an absolute location is not particularly specified.

Further, in denotation of reference numerals for elements of the drawings, the same elements are denoted by the same reference numerals even though they are indicated in another drawing, that is, the same reference numerals denote the same elements throughout the specification.

In the accompanying drawings, the sizes, locations, coupling relationships of the elements may be partially exaggerated or reduced, or omitted to clearly deliver the spirit of the present invention or for convenience of description, and accordingly, the proportion or scale may not be strict.

Further, in the description of the present disclosure, detailed descriptions of related well-known functions that are determined to unnecessarily obscure the gist of the present disclosure will be omitted.

Hereinafter, embodiments of the present disclosure will be described in detail with reference to the accompanying drawings.

An acoustic resonator 100 according to an embodiment of the present disclosure may be formed by stacking a plurality of layers made of different materials, and the plurality of layers stacked may have a polygonal shape. However, FIG. 2, which depicts a top view in a rectangular shape, illustrates a part of the overall shape for convenience of description.

FIG. 1 is a cross-sectional view of an acoustic resonator according to an embodiment of the present disclosure.

Figure 2:
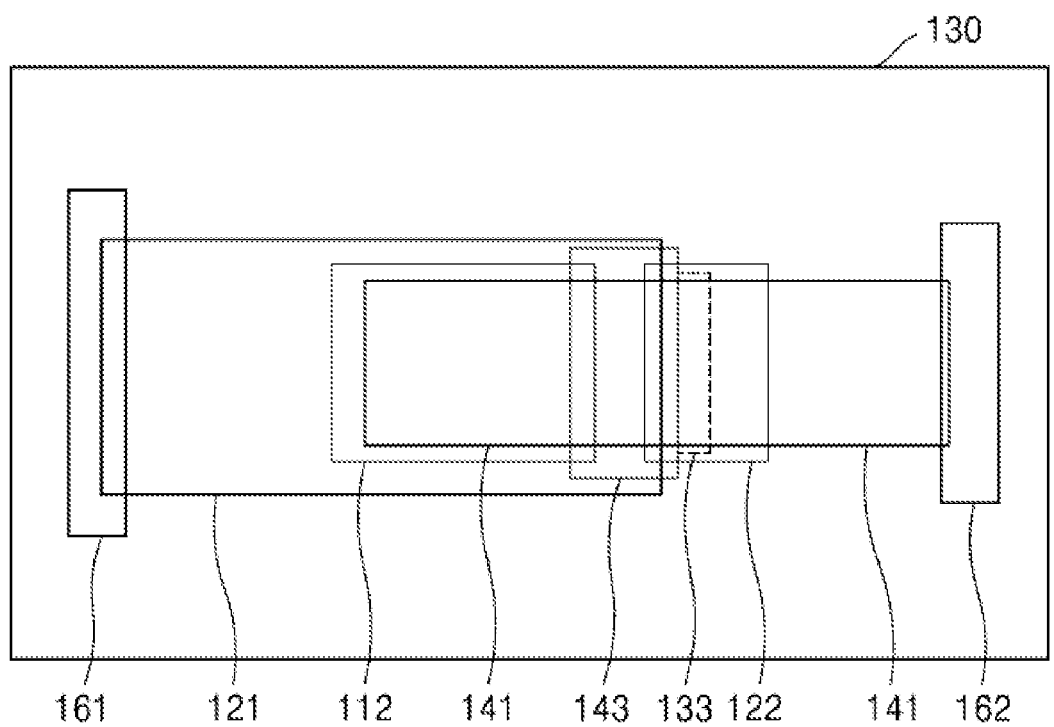
FIG. 2 is a top view of an acoustic resonator according to an embodiment of the present disclosure.

FIG. 2 is a top view of an acoustic resonator according to an embodiment of the present disclosure.

FIG. 2 is provided to illustrate more specifically a left-right relationship between layers depicted in FIG. 1. A differential change in vertical length of the depicted layers is to avoid confusion according to the stacking order, and thus the vertical length of each layer may be differently formed from that shown in FIG. 2.

Although an acoustic resonator according to an embodiment of the present disclosure does not have up and down or left and right directionality, up and down or left and right direction will be indicated with respect to the acoustic resonator 100 depicted in FIG. 1 for convenience of description.

Figure 3:
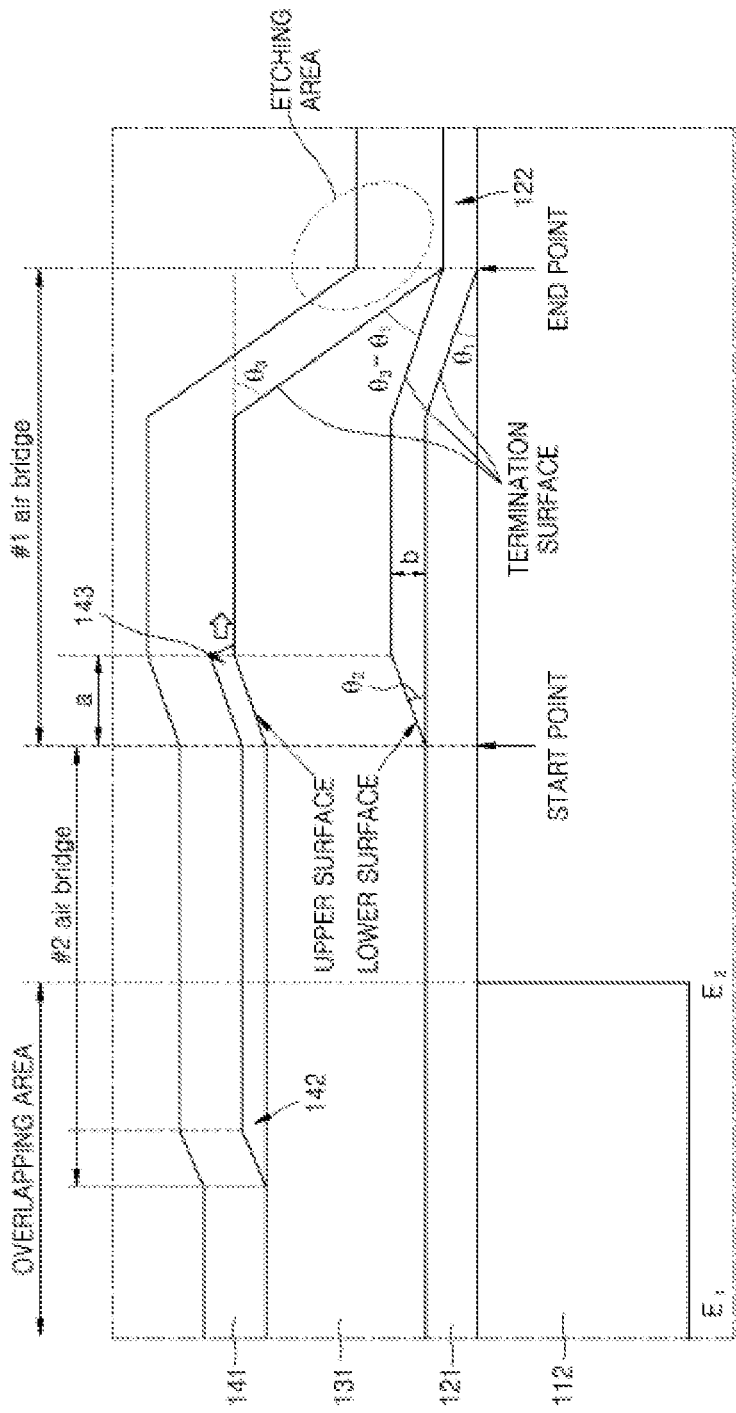
FIG. 3 is an exemplary view for describing a structure of an acoustic resonator according to an embodiment of the present disclosure.

Referring to FIG. 1, the acoustic resonator 100 may include a substrate 111, a first cavity 112, a first protective layer 113, a first electrode (lower electrode) 121, a piezoelectric layer 131, a second electrode (upper electrode) 141, and a second protective layer 150 in an upward direction from a bottom. The first protective layer 113 may be omitted. FIG. 3 is an exemplary view for describing a structure of an acoustic resonator according to an embodiment of the present disclosure.

Referring to FIG. 3, the first electrode 121 and the piezoelectric layer 131 may include an overlapping area that correspond to a first end (one end) E1 and a second end (the other end) E2 of the first cavity 112 that are not illustrated in the drawing. The first electrode 121 may have a termination surface formed outside the overlapping area with respect to the second end E2 of the first cavity 112.

The termination surface of the first electrode 121 may be formed as an inclined surface of a first acute angle $\theta_1$. In order to stack and remove a sacrificial layer and to prevent cracks in the edge of the first electrode, the first electrode 121 may be formed such that an angle between its termination surface and the horizontal plane becomes an acute angle, e.g., 45 degree or less, and most preferably, approximately 15 degrees.

Referring to FIG. 3, the piezoelectric layer 131 may be formed to include a first air bridge area which has the second cavity and is formed between the piezoelectric layer 131 and the first electrode 121 in the vertical direction and between the second end of the first cavity 112 and the termination surface of the first electrode 121.

The first air bridge area may start with the upper and lower surfaces of the piezoelectric layer 131, starting from a start point and ending at an end point.

The piezoelectric layer 131 may be terminated by an etching area in a portion thereof, and thereby formed to have a first part 131 to which the first air bridge area belongs and a second part 132 that does not make contact with the first electrode and is spaced apart from the first part 131.

Referring to FIGS. 1 and 2 together, if the piezoelectric layer 130 of FIG. 2 is the entire piezoelectric layer, the piezoelectric layer 130 may be cut into the first part 131 and the second part 132 by an etching area 133 depicted by the etching area 133 depicted by a broken line in FIG. 2.

The piezoelectric layer 131 may be formed such that a termination surface of the first part formed by the etching area 133 overlaps the termination surface of the first electrode. Referring to FIG. 3, the first electrode 121 and the piezoelectric layer 131 may be formed to terminate at the end point.

Specifically, when described in more detail, in the first air bridge area of the piezoelectric layer 131, the upper and lower surfaces of the piezoelectric layer 131 may extend upwardly at a second acute angle θ2 and then extend horizontally along the second electrode. The upper surface of the piezoelectric layer 131 in contact with the second electrode may be downwardly inclined at a third acute angle θ3 and terminated and the lower surface in contact with the second cavity may be downwardly inclined at the first acute angle θ1 and terminated.

The first acute angle θ1 formed by the termination surface of the first electrode 121 and the horizontal plane, the second acute angle θ2 at which the air bridge area of the piezoelectric layer 131 starts, and the third acute angle θ3 formed by the termination surface of the first part of the piezoelectric layer 131 and the horizontal plane may be, for example, 45 degrees or less, and the third acute angle θ3 may be greater than the first acute angle θ1. In particular, it is most preferable that the first acute angle 81 and the second acute angle θ2 may be 15 degrees.

The piezoelectric layer 131 may have the termination surface with a thickness equal to a difference between the third acute angle θ3 and the first acute angle 81.

Referring back to FIG. 3, when the angle formed by the termination surface of the first electrode 121 and the horizontal plane is the first acute angle θ1 and the angle formed by the upper termination surface of the piezoelectric layer 131 and the horizontal plane is the third acute angle θ3, an angle formed by the upper and lower termination surfaces of the piezoelectric layer 131 is a value obtained by subtracting the first acute angle θ1 from the alternate angle of the third acute angle θ3, and thus is θ3−θ1.

Referring back to FIGS. 1 to 3, the acoustic resonator 100 may lower electrical resistance of the electrode by expanding the thickness of the second electrode 141, so that the overall conductivity may be improved. Since the second electrode 141 is paired with the first electrode 121 with the piezoelectric layer 131 interposed therebetween, space for increasing the thickness is narrow. Thus, in order to expand the thickness of the first electrode 121 and reduce stress on the piezoelectric layer 131, it is necessary to divide the piezoelectric layer 131 into two parts spaced apart from each other.

A portion of the piezoelectric layer 131 may be removed through an etching operation, i.e., the etching area depicted in FIG. 3. In particular, the piezoelectric layer 130 may be etched so that some regions thereof are separated from each other through a groove on the inclined surface in a cross-section view.

Since the second electrode 141 is formed on the piezoelectric layer 130, the shape of the second electrode 141 may be determined according to the shape of the piezoelectric layer 130. That is, the second electrode 141 may be formed to fill the etching area of the piezoelectric layer 130.

Specifically, the second electrode 141 may be formed in a V- or U-shape in the direction of the first electrode 121 so as to cover the inclined termination surfaces of the first part 131 and the second part 132 of the piezoelectric layer 130 which are spaced apart from each other in the etching area. The second electrode 141 may extend in a V- or U-shape.

It may be problematic how far the second electrode 141 extends. The second electrode 141 may extend within a range that will not interfere with the first electrode 121. Thus, the first electrode 121 may be configured to be terminated before the second electrode 141 extends. Even when the first electrode 121 is terminated, the first electrode 121 and the second electrode 141 need to maintain a minimum distance therebetween in order to prevent generation of noise such as parasite capacitance, and hence a second cavity 122 corresponding to a inter-electrodes cavity between the first electrode 121 and the second electrode 141 is required to be formed. Therefore, the lowermost surface in the V- or U-shape of the second electrode 141 may be formed to make contact with the second cavity 122.

The second cavity 122 may function to prevent generation of parasite capacitance between the first electrode 121 and the second electrode 141.

The second cavity 122 may be filled with air or a dielectric material. In addition, a third cavity 142 formed at a lower portion of the bridge area of the second electrode 141 may be filled with air or a dielectric material.

Since the second cavity 122 that corresponds to the inter-electrodes cavity between the first electrode 121 and the second electrode 141 has a dielectric constant difference from the adjacent medium, energy loss is minimized by reducing electrical loss and driving the resonator only in an active area of the resonator so that the Q-value can be increased.

In addition, the first protective layer 113 may be selectively formed between the substrate 111 and the first electrode 121, and the second protective layer 150 may be formed on one surface of the second electrode 141.

Referring to FIG. 2, the acoustic resonator 100 may be configured to further include a first metal pattern layer 161 and a second metal pattern layer 162 that are referred to as "pads". That is, the acoustic resonator 100 may be configured to further include the conductive metal pattern layers 161 and 162 that are formed respectively on the first electrode 121 and the second electrode 141 outside the overlapping area with respect to one end of the first cavity 112. The metal pattern layers 161 and 162 may serve to electrically connect to external components.

The substrate 111 may be implemented using a semiconductor substrate, particularly a silicon wafer, among various substrate materials, and more preferably using a high-resistivity substrate.

The first cavity 111 may be formed in a portion of the substrate 111. That is, the first cavity 112 may be formed in a trench shape extending over the first and second ends E1 and E2 in a portion of one surface, i.e., an upper surface of the substrate 111. The first cavity 112 may be formed through bonding of a preformed first electrode or a process of forming a sacrificial layer.

The first cavity 112 may act as a reflective element, and the arranged position thereof is important for the acoustic resonator. Referring to the first cavity 112 depicted in FIG. 1, the left side constituting the width of the first cavity 112 will be referred to as a first end E1 and the right side will be referred to as a second end E2. In addition to the first electrode 121, the piezoelectric layer 131, and the second electrode 141 that constitute the overlapping area, a modified structure of the second electrode 141 is correlated with the first cavity 112 having a width from the first end to the second end.

The first cavity 112 may be formed by forming a trench area on one surface of the substrate 111, then forming an insulating layer in the trench area, depositing a sacrificial layer above the insulating layer, planarizing the sacrificial layer above the insulation layer through etching, and removing the sacrificial layer. In addition, after a space area of the first cavity 112 is formed, a preformed first electrode may be bonded above the first cavity 112.

The sacrificial layer may be formed using a material such as polysilicon, tetraethyl orthosilicate, phosphosilicate glass (PSG), and the like, which has high surface roughness, and it is easy to form or remove the sacrificial layer using the same. In one embodiment, polysilicon may be used for the sacrificial layer, and polysilicon has excellent surface roughness and is easy to form and remove, and particularly, can be removed by dry etching in a follow-up process.

In a state in which the sacrificial layer is not removed from the overlapping area of the first cavity 112, the first protective layer 113 may be selectively formed to cover the sacrificial layer and the substrate 111. In order to implement the first protective layer 113, a thermal oxide film that can be easily grown on the substrate 111 may be used or an oxide film or nitride film using a conventional deposition process, such as chemical vapor deposition, may be used.

The first electrode 121 may be formed on one surface of the substrate 111. That is, in the absence of the first protective layer 113, the first electrode 121 may be suspended over the first cavity 112 and may be formed to cover the entire or partial area of the substrate 111 in which the first cavity 112 does not exist. FIG. 2 depicts the first electrode 121 formed to cover the first cavity 112 and a portion of the substrate 111. Particularly, the first electrode 121 may be formed to be terminated outside the first cavity 112 with respect to the second end E2 of the first cavity 112. Referring to FIG. 1, the edge of the termination of the first electrode 121 may be a downward slope.

The first electrode 121 and the second electrode 141 may correspond to an input terminal and an output terminal for an electrical signal. The first electrode 121 may be implemented with a conductive material.

The first electrode 121 may be formed on the first protective layer 113 or the substrate 111. When the sacrificial layer exists in the first cavity 112 of the substrate 111, the first electrode 121 may be formed on the sacrificial layer.

The first electrode 121 may be formed by depositing a predetermined material on one surface of the substrate 111 and then patterning the material. A material for use in the first electrode 121 is a common conductor, such as metal, preferably one of aluminum (Al), tungsten (W), gold (Au), platinum (Pt), nickel (Ni), titanium (Ti), chromium (Cr), palladium (Pd), ruthenium (Ru), rhenium (Re) and molybdenum (Mo). A thickness of the first electrode 121 may be in the range of 10 to 1000 nm.

The piezoelectric layer 130 may be formed on a surface of the first electrode 121 which is opposite to the surface in contact with the substrate 111. The first part 131 of the piezoelectric layer formed on the first electrode 121 may be formed not to cover a portion of the first electrode 121. For example, referring to FIG. 2, the first metal pattern layer 161 may be formed on a portion of the first electrode 121 which is not covered by the first part 131 of the piezoelectric layer and thus is exposed.

In addition, as the first electrode 121 is terminated, the piezoelectric layer 131 may be terminated and thus may have a sloped edge. It may be preferably that the piezoelectric layer 131 is formed not to cover the edge of the first electrode 121.

The piezoelectric layer 131 may be configured as a piezoelectric element. When an electrical signal is applied between the first electrode 121 and the second electrode 141, the piezoelectric layer 131 may generate an elastic wave due to the piezoelectric material.

The piezoelectric layer 131 may be formed by depositing the piezoelectric material on a surface of the first electrode 121 which is opposite to the surface in contact with the substrate 111 and then patterning the deposited material. The piezoelectric material constituting the piezoelectric layer 131 may be aluminum nitride (AlN) or zinc oxide (ZnO). As for the deposition method, RF magnetron sputtering, evaporation, or the like may be used. A thickness of the piezoelectric layer 131 may be in the range of 5 to 500 nm.

The second electrode 141 and the first electrode 121 may correspond to an input terminal and an output terminal for an electrical signal. The second electrode 141 may be implemented with a conductive material.

The second electrode 141 may be formed by depositing and patterning an electrode metal film on a predetermined area of one surface of the piezoelectric layer 131. The second electrode 141 may be formed by the same material, deposition method and patterning method as those used for the first electrode 121. A thickness of the second electrode 141 may be in the range of 5 to 1000 nm.

A material for use in the second electrode 141 is a common conductor, such as metal, preferably one of aluminum (Al), tungsten (W), gold (Au), platinum (Pt), nickel (Ni), titanium (Ti), chromium (Cr), palladium (Pd), ruthenium (Ru), rhenium (Re) and molybdenum (Mo).

When an electrical signal is applied to the acoustic resonator 100 through the first electrode 121 and the second electrode 141, the acoustic resonator 100 resonates with respect to a frequency of natural oscillation according to a thickness of the piezoelectric layer 131 while part of electrical energy input is converted into mechanical energy according to a piezoelectric effect and is converted again into electrical energy.

The acoustic resonator 100 according to an embodiment of the present disclosure may be configured to have an overlapping area in which the planar areas of the first electrode 121 and the second electrode 141 and the piezoelectric layer 131 commonly overlap, in other words, an active area. In addition, the substrate 111 may be configured to have the first cavity 112 that corresponds to a reflective area between the substrate 111 and the first electrode 121 overlapping the active area. That is, the first cavity 112 may be formed between the first electrode 121 and the substrate 111 while overlapping the active area thereabove.

Referring back to FIG. 3, a wing area of the second electrode 141 and a fifth cavity (not shown) formed by the wing area may be disposed above the first end of the first cavity 112 that overlaps the active area, and a bridge area of the second electrode 141 and the third cavity 142 formed by the bridge area may be disposed above the second end of the first cavity 112.

The active area may be distributed in an area where the planar areas of the first electrode 121, the piezoelectric layer 131, and the second electrode 141 commonly overlap. The wing area of the second electrode may be disposed on one end of the active area and a second air bridge area of the second electrode may be disposed on the other end of the active area.

When the first electrode 121 is terminated outside the overlapping area, i.e., the active area, the piezoelectric layer 131 may be formed to be terminated corresponding thereto. Accordingly, an area in which the piezoelectric layer 131 does not cover the edge of the first electrode 121 may be formed.

Among various functions of the active area, heat generated in the active area may be transferred to the substrate 111.

With the development of mobile communication, higher frequency is used, and accordingly, a filter is getting smaller and thinner. Drawbacks of film-thinning include mechanical issue related to a structure, electrical issues related to conduction, and thermodynamic issues related to heat transfer.

The thermodynamic issue is that the amount of heat generated increases as the amount of charges rapidly increases due to high power consumption of electrodes of a filter that processes high-frequency waves. The electrical issue is that the electrical resistance of the electrode increases according to the film-thinning of the filter based on Ohm's law.

As a method of compensating for the increase in electrical loss of the electrode, a method of reinforcing the thickness of the electrode based on Ohm's law may be considered.

The acoustic resonator 100 according to an embodiment of the present disclosure may include, as a structure for compensating for the electrical loss among the issues discussed above, an area in which the thickness of the second electrode 141 is reinforced. That is, the second electrode 141 may be formed to have an extended area having a thickness greater than that of the overlapping area at a position adjacent to at least one of the first and second ends E1 and E2 of the overlapping area, i.e., the active area.

The wing area may be disposed above the first end of the overlapping area, i.e., the active area. That is, the wing area may be disposed above the first end of the first cavity 112. The second electrode 141 in the wing area may be formed to have the fifth cavity between the second electrode 141 and the piezoelectric layer 131. Also, an upper surface of the second electrode 141 in the wing area may be out of plane and the thickness may be reinforced. One end and the other end of the wing area may make contact with the piezoelectric layer 131 so that the cavity may be closed-shaped. The fifth cavity may be filled with a dielectric material or air.

Referring to FIG. 3, the second electrode 141 may include a second air bridge area that extends toward the outside of the overlapping area with respect to the second end of the active area, i.e., the overlapping area. In addition, the second air bridge area of the second electrode 141 may be formed to have the third cavity 142 between the second electrode 141 and the piezoelectric layer 131. That is, the third cavity 142 may be formed between the piezoelectric layer 131 and the second electrode 141 by the second air bridge area of the second electrode 141.

In order to form the third cavity 142, the second electrode 141 and the piezoelectric layer 131 need to be partially separated from each other. A bridge-like structure is suitable to form a separated state.

Like the second cavity 122, the third cavity 142 may also be closed-shaped. The second cavity 122 may also be filled with a dielectric material or air.

The height of the third cavity 142 may be smaller than or equal to half a thickness of the piezoelectric layer 131. The third cavity 142 is formed so that a thickness varies in each area of the piezoelectric layer 131. The height of the third cavity 142 is formed to be smaller than or equal to half the thickness of the piezoelectric layer 131 so as to provide a minimum thickness which allows heat generated inside to be easily released. Also, a lateral width of the third cavity 142 may be greater than or equal to a quarter of a wavelength of energy discharged through the piezoelectric layer 131.

The third cavity 142 may be formed by depositing a sacrificial layer above the piezoelectric layer 131, patterning the sacrificial layer by planarization and etching, depositing the second electrode 141 above the piezoelectric layer 131 including the remaining sacrificial layer, and then removing the sacrificial layer. In this case, the sacrificial layer may be deposited after a void portion is formed in a portion above the piezoelectric layer 131.

Here, the sacrificial layer may be formed using a material such as polysilicon, tetraethyl orthosilicate, phosphosilicate glass (PSG), and the like, which has high surface roughness, and it is easy to form or remove the sacrificial layer using the same. The second cavity 122 may be formed using the same process as used for forming the third cavity 142.

The acoustic resonator 100 according to an embodiment of the present disclosure may be configured to further include a conductive first metal pattern layer 161 formed to cover a edge of the first electrode 121 which is exposed as the piezoelectric layer 131 is terminated.

In addition, the acoustic resonator 100 according to an embodiment of the present disclosure may be configured to further include a second metal pattern layer 162 formed in an area where the second electrode 141 is exposed as the second protective layer 150 is terminated.

The metal pattern layers 161 and 162 according to an embodiment of the present disclosure may be disposed as close to the active area as possible. As a result of the proximity of the metal pattern layers to the active area, electrical losses of the first electrode 121 and the second electrode 141 may be reduced.

Referring back to FIG. 2, the metal pattern layers 161 and 162 correspond to metal pads to which signal lines of an external circuit device connected to the first electrode 121 and the second electrode 141 are connected. One end of each of the metal pattern layers 161 and 162 may be inclined to have a uniform thickness to correspond to the shape of one end of the piezoelectric layer 131.

The metal pattern layers 161 and 162 may be formed of conductive metal at a position outside the active area. The metal forming the metal pattern layers 161 and 162 includes gold (Au), copper (Cu), aluminum (Al), an aluminum-copper alloy (AlCu), and the like. The Q-value may be improved by forming the metal pattern layers 161 and 162.

The second electrode 141 may extend in the direction of the first electrode 121 according to the shapes of termination surfaces of the first part 131 and the second part 132 of the piezoelectric layer. The second electrode 141 may extend in a V- or U-shape according to a curve.

Also, the first part 131 and the second part 132 of the piezoelectric layer may have different heights according to the termination of the first electrode 121.

Here, the bridge area and the extension area may be formed in shapes similar to an anticline and a syncline of folds.

Since the thickness of the second electrode 141 at a position outside the active area is reinforced, resistance of the electrode with the reinforced thickness decreases. Accordingly, current is collected at the edge of the electrode and flows to an electrode lead so that the Q value can be increased. That is, the resistance decreases in the reinforced area of the second electrode 141, so that the flow of charges per unit time may increase.

In addition, heat concentrated in the active area may be transferred to the outside through the substrate 111.

Further, heat generated in the active area is transferred to the substrate through the thickness compensation of the first electrode 121, so that heat transfer may be improved.

Referring back to FIG. 1, the acoustic resonator 100 may be configured to include the second protective layer 150. The second protective layer 150 may be formed on a surface of the second electrode 141 which is opposite to the surface in contact with the piezoelectric layer 131 and 132. The second protective layer 150 may be formed on a recess frame and a raised frame formed on the second electrode 141.

The second protective layer 150 may function as a passivation layer to protect the first electrode 121, the piezoelectric layer 131 and 132, and the second electrode 141. The second protective layer 150 may be formed such that an edge of one end thereof coincides with the edge of one end of the second electrode 141.

Technical features included the acoustic resonator 100 according to an embodiment of the present disclosure may be described by a fabrication method. A specific fabrication process of the acoustic resonator 100 has been described above, and thus characteristic points thereof will be described in brief.

Figure 4:
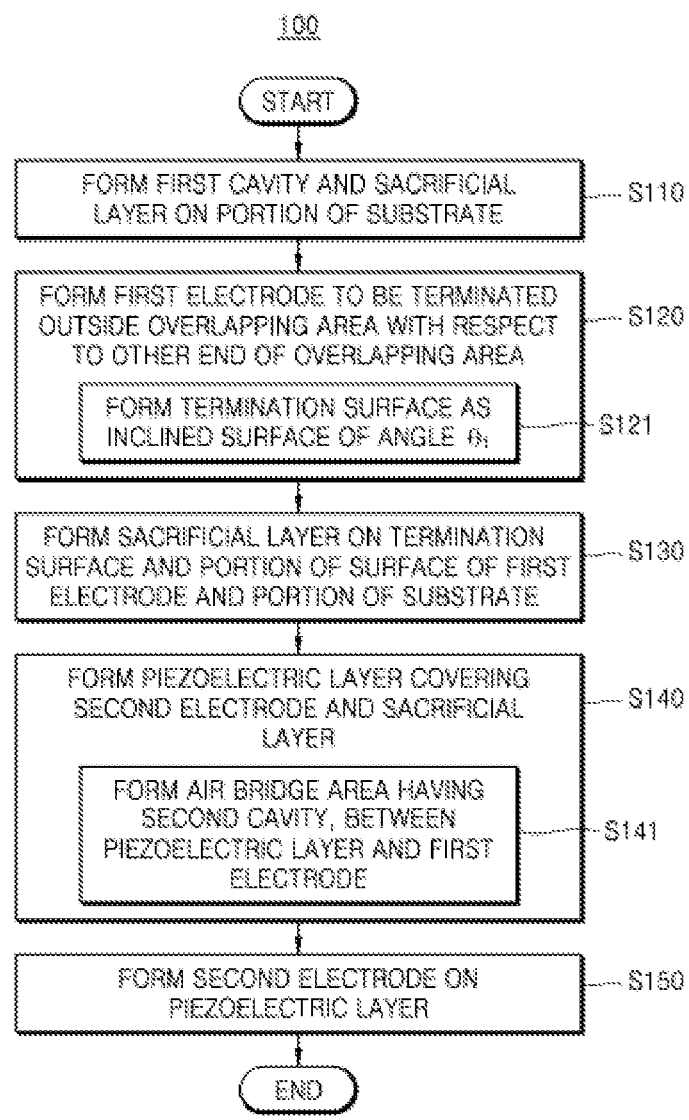
FIG. 4 is a flowchart of a fabrication method of an acoustic resonator according to an embodiment of the present disclosure.

FIG. 4 is a flowchart of a fabrication method S100 of an acoustic resonator according to an embodiment of the present disclosure.

A main process of the fabrication method S100 of an acoustic resonator will be described with reference to FIGS. 1 and 4 together. The fabrication method S100 of an acoustic resonator may include the steps of forming the first cavity 112 and a sacrificial layer on a portion of the substrate 111 (S110), forming the first electrode 121 to be terminated outside an overlapping area with respect to a second end of the overlapping area (S120), forming a sacrificial layer on a termination surface and a portion of a surface of the first electrode 121 and a portion of a surface of the substrate 111 (S130), forming the piezoelectric layer that covers the second electrode and the sacrificial layer (S140), and forming the second electrode on the piezoelectric layer (S150).

The first cavity 112 may be formed in a trench shape on a portion of the substrate 111 (S11). The first cavity 112 may have a width from a first end E1 to a second end E2.

The first electrode 121 may include the first cavity 112 and may be formed above the substrate 111. That is, in the absence of the first protective layer 113, the first electrode 121 may be formed on an upper surface of the substrate 111. In the presence of the first protective layer 113, the first electrode 121 may be formed on the first protective layer 113.

The first electrode 121 may include an overlapping area that corresponds to the first and second ends E1 and E2 of the first cavity. Also, the first electrode 121 may be formed to be terminated outside the overlapping area with respect to the second end E2 of the overlapping area.

The first part 131 of the piezoelectric layer may be formed on one surface of the first electrode and formed to be terminated outside the overlapping area in the same manner as in the first electrode 121. However, the first part 131 of the piezoelectric layer may be formed to be terminated before the first electrode 121 is terminated so that the first part 131 does not cover the termination surface of the first electrode 121.

The first part 131 of the piezoelectric layer may be formed to include the first air bridge area in which the upper and lower surfaces of the first part 131 extend upwardly at a second acute angle θ2, the upper surface of the first part 131 in contact with the second electrode is downwardly inclined at a third acute angle θ3 and terminated and the lower surface in contact with the second cavity 122 is downwardly inclined at the first acute angle θ1 and terminated.

Here, the first acute angle θ1, the second acute angle θ2, and the third acute angle θ3 may be 45 degrees or less, and the third acute angle θ3 may be greater than the first acute angle θ1.

The second electrode 141 may be formed to extend in the direction of the first electrode 121 along the termination surface of the piezoelectric layer 131.

Figure 5:
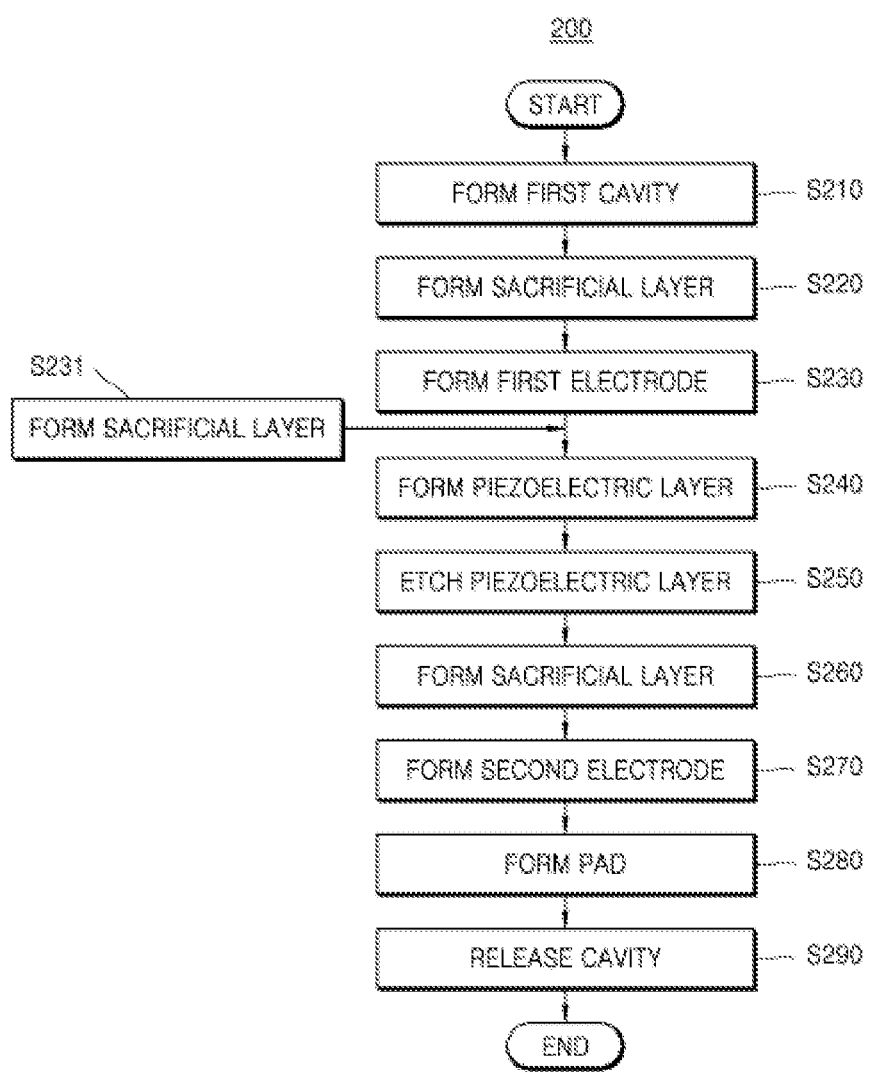
FIG. 5 is a flowchart of a fabrication method of an acoustic resonator according to an embodiment of the present disclosure.

FIG. 5 is a flowchart of a fabrication method of an acoustic resonator according to an embodiment of the present disclosure.

A fabrication method S200 of the acoustic resonator 100 will be described with reference to FIG. 5. The fabrication method S200 of the acoustic resonator 100 may include the steps of forming a first cavity in a trench shape on the substrate 111 (S210), forming a sacrificial layer in a space of the first cavity 112 (S220), optionally forming the first protective layer 113 on the sacrificial layer and the substrate, forming the first electrode on a portion of the sacrificial layer and a portion of the substrate or on the first protective layer 113 (S230), forming a sacrificial layer for forming the second cavity 122 between a portion of the first electrode, a termination surface of the first electrode and the first electrode 121 and the piezoelectric layer (S231), forming a piezoelectric layer which covers the sacrificial layer and the first electrode (S240), etching an etching area of the piezoelectric layer 130 (S250), forming a sacrificial layer for forming a third cavity between the piezoelectric layer 130 and the second electrode 141 (S260), forming the second electrode on the piezoelectric layer 130 and the sacrificial layer (S270), forming a pad which corresponds to a metal pattern layer (S280), and releasing the sacrificial layers that fill the various cavities (S290).

As described above, according to an embodiment of the present disclosure, it is possible to effectively prevent the operation of a piezoelectric layer outside the active area.

In addition, the piezoelectric layer is partially removed so that stress on the piezoelectric layer may be released.

Also, it is possible to prevent energy from escaping in a lateral direction.

Although the present disclosure has been particularly shown and described with reference to exemplary embodiments thereof, various embodiments disclosed in "DETAILED DESCRIPTION OF THE EMBODIMENTS" are provided only for the illustrative purpose. Those skilled in the art will understand that various modifications and changes may be made or equivalents of the present disclosure are possible based on the above description.

In addition, the present disclosure may be embodied in many different forms and should not be construed as being limited to the embodiments set forth herein. Rather, these embodiments are provided so that this disclosure will be thorough and complete and will fully convey the concept of the invention to those skilled in the art, and the present disclosure will only be defined by the appended claims.

What is claimed is:

1. An acoustic resonator comprising:
a substrate including a first cavity;
a first electrode formed above the substrate;
a piezoelectric layer formed on one surface of the first electrode; and
a second electrode formed on one surface of the piezoelectric layer,
wherein the first electrode and the piezoelectric layer include an overlapping area that corresponds to a first end and a second end of the first cavity, the first electrode has a termination surface formed as an inclined surface of a first acute angle θ1 outside the overlapping area with respect to the second end of the first cavity, the piezoelectric layer is formed to include a first air bridge area that has a second cavity and is formed between the piezoelectric layer and the first electrode in a vertical direction and between the second end of the first cavity and the termination surface of the first electrode in a horizontal direction, and the piezoelectric layer is terminated by an etching area in a portion thereof and thereby formed to have a first part to which the first air bridge area belongs and a second part that does not make contact with the first electrode and is spaced apart from the first part.

2. The acoustic resonator of claim 1, wherein the piezoelectric layer is formed such that a termination surface of the first part formed by the etching area overlaps the termination surface of the first electrode.

3. The acoustic resonator of claim 1, wherein the second electrode is formed in a V- or U-shape or in a shape similar to a V- or U-shape in a direction of the first electrode so as to cover inclined termination surfaces of the first part and the second part that are spaced apart from each other in the etching area.

4. The acoustic resonator of claim 3, wherein the second electrode is formed such that a lowermost surface of the V- or U-shape or the shape similar to a V- or U-shape makes contact with the second cavity.

5. An acoustic resonator comprising:
a substrate including a first cavity;
a first electrode formed above the substrate;
a piezoelectric layer formed on one surface of the first electrode; and
a second electrode formed on one surface of the piezoelectric layer,
wherein the first electrode and the piezoelectric layer include an overlapping area that corresponds to a first end and a second end of the first cavity, the first electrode has a termination surface formed as an inclined surface of a first acute angle $\theta1$ outside the overlapping area with respect to the second end of the first cavity, the piezoelectric layer is formed to include a first air bridge area that has a second cavity and is formed between the piezoelectric layer and the first electrode in a vertical direction and between the second end of the first cavity and the termination surface of the first electrode in a horizontal direction, the piezoelectric layer is formed to include the first air bridge area in which upper and lower surfaces of the piezoelectric layer extend upwardly at a second acute angle $\theta2$, and the upper surface in contact with the second electrode is downwardly inclined at a third acute angle $\theta3$ and terminated and the lower surface in contact with the second cavity is downwardly inclined at the first acute angle $\theta1$ and terminated.

6. The acoustic resonator of claim 5, wherein each of the first acute angle $\theta1$, the second acute angle $\theta2$, and the third acute angle $\theta3$ is 45 degrees or less and the third acute angle $\theta3$ is greater than the first acute angle $\theta1$.

7. The acoustic resonator of claim 5, wherein the piezoelectric layer has the termination surface with a thickness equal to a difference between the third acute angle $\theta3$ and the first acute angle $\theta1$.

8. An acoustic resonator comprising:
a substrate including a first cavity;
a first electrode formed above the substrate;
a piezoelectric layer formed on one surface of the first electrode; and
a second electrode formed on one surface of the piezoelectric layer,
wherein the first electrode and the piezoelectric layer include an overlapping area that corresponds to a first end and a second end of the first cavity, the first electrode has a termination surface formed as an inclined surface of a first acute angle $\theta1$ outside the overlapping area with respect to the second end of the first cavity, the piezoelectric layer is formed to include a first air bridge area that has a second cavity and is formed between the piezoelectric layer and the first electrode in a vertical direction and between the second end of the first cavity and the termination surface of the first electrode in a horizontal direction, and the second electrode includes a second air bridge area that has a third cavity and is formed between the second electrode and the piezoelectric layer in the vertical direction and in a portion of the overlapping area in the horizontal direction.

9. The acoustic resonator of claim 8, wherein the second electrode is formed to have a fourth cavity with a width proportional to a thickness of the second cavity, between the second electrode and an upwardly inclined surface of the piezoelectric layer.

10. The acoustic resonator of claim 9, wherein the fourth cavity is formed to overlap the second cavity and an overlapping area of the fourth cavity and the second cavity extends beyond the upwardly inclined surface.

11. The acoustic resonator of claim 9, wherein the fourth cavity on the piezoelectric layer which is formed by the first air bridge area of the piezoelectric layer is connected to the third cavity formed by the second air bridge area of the second electrode.

* * * * *